United States Patent
Shindo et al.

(10) Patent No.: US 10,290,425 B2
(45) Date of Patent: May 14, 2019

(54) COMPOSITE ELECTRONIC COMPONENT

(71) Applicant: Murata Manufacturing Co., Ltd., Nagaokakyo-shi, Kyoto-fu (JP)

(72) Inventors: Satoshi Shindo, Nagaokakyo (JP); Yutaka Takeshima, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 176 days.

(21) Appl. No.: 15/209,917

(22) Filed: Jul. 14, 2016

(65) Prior Publication Data

US 2016/0322164 A1 Nov. 3, 2016

Related U.S. Application Data

(63) Continuation of application No. PCT/JP2015/071917, filed on Aug. 3, 2015.

(30) Foreign Application Priority Data

Aug. 6, 2014 (JP) .................................. 2014-160212

(51) Int. Cl.
*H01G 4/33* (2006.01)
*H01G 4/40* (2006.01)
(Continued)

(52) U.S. Cl.
CPC .................. *H01G 4/33* (2013.01); *H01G 4/40* (2013.01); *H01L 23/293* (2013.01); (Continued)

(58) Field of Classification Search
CPC . H01G 4/33; H01G 4/40; H01L 28/60; H01L 23/528; H01L 27/016; H01L 28/40; H01L 28/20; H01L 23/293; H01L 23/49822
See application file for complete search history.

(56) References Cited

U.S. PATENT DOCUMENTS 7,358,592 B2 * 4/2008 Ueno ................... H01L 27/0688
257/359
7,638,875 B2 * 12/2009 Chiang ............... H01L 21/4857
257/700

(Continued)

FOREIGN PATENT DOCUMENTS

JP 2001177004 A 6/2001
JP 2004056097 A 2/2004

(Continued)

OTHER PUBLICATIONS

International Search Report issue for PCT/JP2015/071917, dated Oct. 27, 2015, 2 pages.

(Continued)

*Primary Examiner* — Nathan Milakovich
(74) *Attorney, Agent, or Firm* — Arent Fox LLP

(57) ABSTRACT

A composite electronic component that includes an insulation substrate having a principal surface; a thin-film capacitor on the principal surface of the insulation substrate; a laminated insulation protection layer covering the thin-film capacitor; a first extended wiring in the insulation protection layer and connected to the thin-film capacitor; a first resin layer on the insulation protection layer, first and second thin-film resistors in the first resin layer; a through-hole penetrating the first resin layer in a thickness direction thereof so as to expose the first extended wiring; a first rewiring in the first resin layer and connected to the first extended wiring through the through-hole; and a second resin layer on the first resin layer. The interior of the through-hole is filled with the second resin layer, and the through-hole does not overlap the thin-film capacitor.

10 Claims, 3 Drawing Sheets

(51) Int. Cl.
*H01L 49/02* (2006.01)
*H01L 23/29* (2006.01)
*H01L 23/528* (2006.01)
*H01L 27/01* (2006.01)
*H01L 23/498* (2006.01)

(52) U.S. Cl.
CPC .......... *H01L 23/528* (2013.01); *H01L 27/016* (2013.01); *H01L 28/20* (2013.01); *H01L 28/40* (2013.01); *H01L 28/60* (2013.01); *H01L 23/49822* (2013.01); *H01L 2224/13* (2013.01); *H01L 2924/0002* (2013.01)

(56) References Cited

U.S. PATENT DOCUMENTS

| | | | | |
|---|---|---|---|---|
| 7,981,759 | B2 * | 7/2011 | Cervin-Lawry | H01G 4/33 257/E21.004 |
| 8,058,951 | B2 * | 11/2011 | Yamamoto | H01L 23/66 333/184 |
| 9,633,795 | B2 * | 4/2017 | Ashimine | C23C 14/20 |
| 9,704,847 | B2 * | 7/2017 | Nakaiso | H01L 27/0248 |
| 2002/0043399 | A1 | 4/2002 | Sasaki et al. | |
| 2003/0219956 | A1 | 11/2003 | Mori et al. | |
| 2008/0164563 | A1 | 7/2008 | Nomura et al. | |
| 2013/0088811 | A1 * | 4/2013 | Takeshima | H01G 4/232 361/311 |
| 2014/0225793 | A1 * | 8/2014 | Ikemoto | H04B 5/0062 343/748 |
| 2016/0351556 | A1 * | 12/2016 | Nakaiso | H01L 27/0805 |
| 2017/0125398 | A1 * | 5/2017 | Nomura | H01L 27/0248 |
| 2017/0271318 | A1 * | 9/2017 | Nakaiso | H01L 27/0805 |

FOREIGN PATENT DOCUMENTS

| | | | |
|---|---|---|---|
| JP | 2004071589 A | 3/2004 | |
| WO | WO 2006117912 A1 | 11/2006 | |
| WO | WO 2010016171 A1 | 2/2010 | |
| WO | WO 2013061985 A1 * | 5/2013 | ........... H04B 5/0062 |

OTHER PUBLICATIONS

Written Opinion of the International Searching Authority issued for PCT/JP2015/071917, dated Oct. 27, 2015, 3 pages.

* cited by examiner

COMPOSITE ELECTRONIC COMPONENT

CROSS REFERENCE TO RELATED APPLICATIONS

The present application is a continuation of International application No. PCT/JP2015/071917, filed Aug. 3, 2015, which claims priority to Japanese Patent Application No. 2014-160212, filed Aug. 6, 2014, the entire contents of each of which are incorporated herein by reference.

FIELD OF THE INVENTION

The present invention relates to composite electronic components including thin-film capacitors and thin-film circuit elements connected to the thin-film capacitors.

BACKGROUND OF THE INVENTION

Electronic components in which a thin-film capacitor is formed on one principal surface of an insulation substrate have been known. For example, an electronic component as shown in FIG. 5 is disclosed in Patent Document 1. In an electronic component 100 disclosed in Patent Document 1, a thin-film capacitor 103 is formed on an insulation substrate 101, in which a SiO2 film 101b is formed on one principal surface of a Si layer 101a, with a close contact layer 102 interposed therebetween. The thin-film capacitor 103 is formed by laminating a lower conductor 103a, a dielectric thin-film 103b, and an upper conductor 103c in that order on the close contact layer 102. A barrier layer 104 is so provided as to cover the thin-film capacitor 103. The barrier layer 104 has a multilayer structure including a dielectric barrier layer 104a and an inorganic barrier layer 104b, and covers the thin-film capacitor 103 while exposing an outer connection area of the upper conductor 103c of the thin-film capacitor 103 and an outer connection area of the lower conductor 103a thereof. In addition, a resin protection layer 105 is so formed as to cover the barrier layer 104. Electrode pads 106a, 106b are extended to the upper surface so as to penetrate through the resin protection layer 105. The electrode pads 106a, 106b are each connected to the outer connection area of any one of the upper conductor 103c and the lower conductor 103a of the thin-film capacitor 103.

Patent Document 1: WO 2006/117912 (see paragraphs [0029]-[0031], FIG. 1, and so on).

SUMMARY OF THE INVENTION

With the advent of miniaturized electronic devices with high-level functions in recent years, electronic components mounted on such electronic devices are being developed so as to be smaller in size and have higher-level functions. For example, by integrating an additional thin-film circuit element into the conventional electronic component 100 and then electrically connecting the thin-film capacitor 103 to the additional thin-film circuit element, the electronic component 100 can have a higher-level function. Further, by making the electronic component 100 have a multilayer structure and forming the additional thin-film circuit element in a layer different from a layer of the thin-film capacitor 103, an area of a principal surface of the insulation substrate 101 can be made smaller. In these cases, although the thin-film capacitor 103 and the additional thin-film circuit element are electrically connected using an in-plane conductor and an interlayer connection conductor, it is efficient to integrally form the in-plane conductor and the interlayer connection conductor using a film deposition technique in the case of the electronic component 100 in which the film deposition technique is used.

However, in a composite electronic component in which a thin-film capacitor and an additional thin-film circuit element are formed as discussed above, in the case where wiring electrodes (in-plane conductor, interlayer connection conductor) and the like connecting the thin-film capacitor and the additional thin-film circuit element are formed with a thin-film, stress that is caused by the formation of the wiring pattern and is applied to the thin-film capacitor has not been considered in any way.

The present invention has been conceived in order to solve the above issue, and an object of the present invention is to reduce stress, in a composite electronic component including a thin-film capacitor and a thin-film circuit element electrically connected to the thin-film capacitor, that is caused by the formation of wiring electrodes connected to the thin-film capacitor and is applied to the thin-film capacitor.

In order to achieve the above object, a composite electronic component according to the present invention includes an insulation substrate; a thin-film capacitor having a plurality of conductor layers and a dielectric thin-film and formed on one principal surface of the insulation substrate; an insulation protection layer that is laminated on the one principal surface of the insulation substrate while covering the thin-film capacitor; a connection-extending through-hole that is formed penetrating the insulation protection layer in a thickness direction thereof so as to expose the thin-film capacitor; a connection-extending electrode film that is formed on one principal surface of the insulation protection layer so as to extend along an inner wall surface of the connection-extending through-hole and is connected to the conductor layer of the thin-film capacitor; a rewiring layer laminated on the insulation protection layer; and at least one thin-film circuit element that is provided in the rewiring layer and electrically connected to the thin-film capacitor. In the composite electronic component, the rewiring layer includes: a first resin layer that is laminated on the one principal surface of the insulation protection layer while covering the connection-extending electrode film; a second resin layer laminated on the first resin layer; a rewiring through-hole that is formed penetrating the first resin layer in the thickness direction so as to expose the connection-extending electrode film at a position overlapping with the connection-extending electrode film when viewed from above; and a rewiring electrode film that is formed on one principal surface of the first resin layer so as to extend along an inner wall surface of the rewiring through-hole and is connected to the connection-extending electrode film. The interior of the rewiring through-hole is filled with a resin that forms the second resin layer, and the rewiring through-hole is formed at a position shifted from the above-mentioned thin-film capacitor when viewed from above in the thickness direction.

With this configuration, since the interior of the rewiring through-hole is filled with the resin of the second resin layer, there is a case in which the resin within the interior of the rewiring through-hole expands under a high humidity condition, a high temperature condition, and so on. In this case, since a portion of the rewiring electrode film extending along the inner wall surface of the rewiring through-hole is thin in film thickness, the stated portion is likely to be deformed when the resin within the interior of the rewiring through-hole expands. At this time, because stress generated along with the above deformation propagates to the periphery of the rewiring through-hole, the stress is applied to the thin-film capacitor if the thin-film capacitor is disposed in the vicinity of the rewiring through-hole. Note that, however, in the present invention, because the rewiring through-hole and the thin-film capacitor can be distanced from each other by forming the rewiring through-hole at a position shifted from the thin-film capacitor when viewed from above in a thickness direction of the rewiring layer, the stress applied to the thin-film capacitor can be reduced.

Further, the composite electronic component may include a first outer terminal to which one end of the thin-film capacitor is connected, a second outer terminal to which the other end of the thin-film capacitor is connected, a third outer terminal to which one end of a first thin-film resistor as the thin-film circuit element is connected, and a fourth outer terminal to which one end of a second thin-film resistor as the thin-film circuit element is connected, where the one end of the thin-film capacitor may be connected to the other end of the first thin-film resistor, and the other end of the thin-film capacitance may be connected to the other end of the second thin-film resistor. In this case, the composite electronic component can be used as a capacitance device that makes use of a bias voltage effect while reducing the stress applied to the thin-film capacitor.

According to the present invention, because a rewiring through-hole and a thin-film capacitor can be distanced from each other by forming the rewiring through-hole at a position shifted from the thin-film capacitor when viewed from above in the thickness direction of the rewiring layer, the stress applied to the thin-film capacitor can be reduced.

DETAILED DESCRIPTION OF THE PREFERRED EMBODIMENTS

Figure 1:
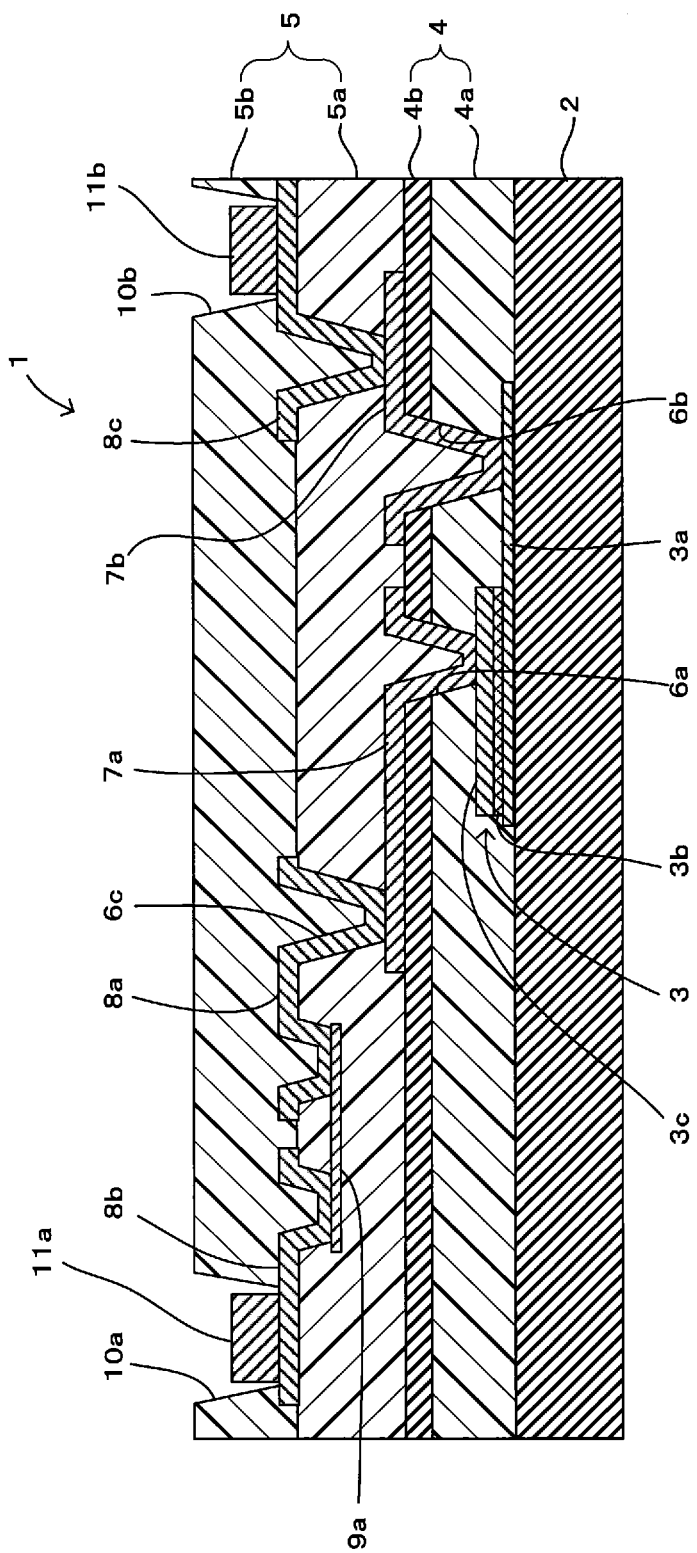
FIG. 1 is a cross-sectional view of a composite electronic component according to a first embodiment of the present invention.
Figure 2:
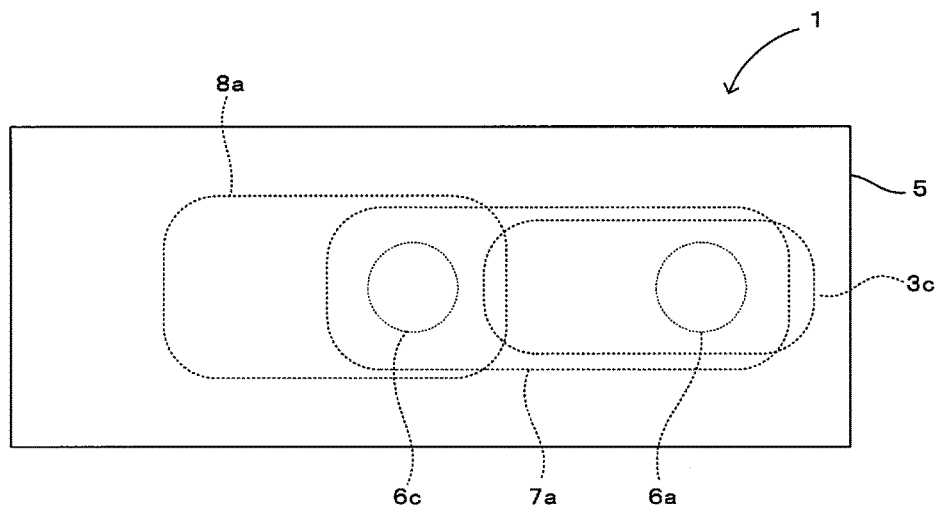
FIG. 2 is a diagram for explaining an arrangement relationship between a thin-film capacitor and a rewiring through-hole shown in FIG. 1.
Figure 3:
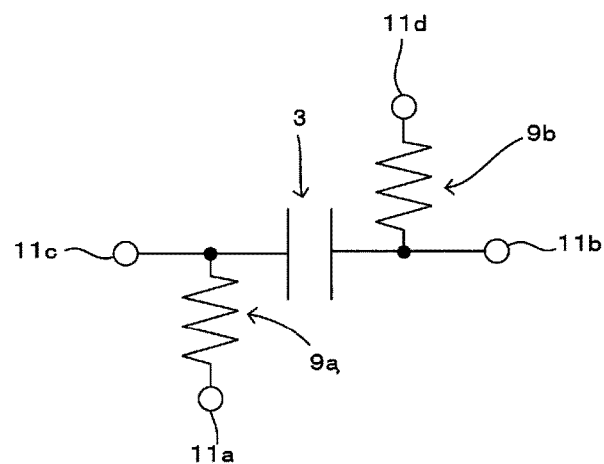
FIG. 3 is a circuit configuration diagram of the composite electronic component shown in FIG. 1.

A composite electronic component 1 according to a first embodiment of the present invention will be described with reference to FIGS. 1 through 3. FIG. 1 is a cross-sectional view of the composite electronic component 1, FIG. 2 is a diagram for explaining an arrangement relationship between a thin-film capacitor 3 and a rewiring through-hole 6c, and FIG. 3 is a circuit configuration diagram of the composite electronic component 1.

The composite electronic component 1 according to the present embodiment includes, as shown in FIG. 1, an insulation substrate 2, a thin-film capacitor 3 formed on one principal surface of the insulation substrate 2, an insulation protection layer 4 laminated on the one principal surface of the insulation substrate 2 while covering the thin-film capacitor 3, a rewiring layer 5 laminated on the insulation protection layer, and thin-film circuit elements 9a and 9b (a thin-film circuit element 9b is not illustrated); and the thin-film capacitor 3 is electrically connected to the thin-film circuit elements 9a and 9b.

The insulation substrate 2 is, for example, a Si substrate, and an upper surface (corresponds to "one principal surface" in the present description) thereof is surface-oxidized to form a $SiO_2$ film.

The thin-film capacitor 3 is formed by laminating a lower electrode film 3a, a dielectric film 3b, and an upper electrode film 3c in that order on the one principal surface of the insulation substrate 2. In the present embodiment, the lower electrode film 3a and the upper electrode film 3c are each formed of a Pt film, and the dielectric film 3b is formed of barium strontium titanate ((Ba, Sr) $TiO_3$; hereinafter called "BST"). Here, the lower electrode film 3a and the upper electrode film 3c each correspond to "conductor layer" in the present description. Further, the dielectric film 3b corresponds to "dielectric film" in the present description. A material for forming the dielectric film 3b is not limited to BST, and various types of dielectric materials such as $BaTiO_3$, $SrTiO_3$, $PbTiO_3$, and $SiO_2$ dielectric can be used. Further, the lower electrode film 3a and the upper electrode film 3c may use, for example, a Cu film, an Al film, or a Ti film in accordance with the types of dielectric materials.

The insulation protection layer 4 is formed by laminating an inorganic protection layer 4a made of $SiO_2$ and a photosensitive polyimide-based resin protection layer 4b in that order on the one principal surface of the insulation substrate 2. Further, in the insulation protection layer 4, a first through-hole 6a (corresponds to "connection-extending through-hole" in the present description) is formed penetrating the insulation protection layer 4 in the thickness direction so as to expose the upper electrode film 3c of the thin-film capacitor 3 at a position overlapping with the upper electrode film 3c when viewed from above. Furthermore, a second through-hole 6b (corresponds to "connection-extending through-hole" in the present description) is formed penetrating the insulation protection layer 4 in the thickness direction so as to expose the lower electrode film 3a at a position overlapping with the lower electrode film 3a when viewed from above.

On the upper surface of the insulation protection layer 4, first extended wiring 7a (corresponds to "connection-extending electrode film" in the present description) connected to the upper electrode film 3c of the thin-film capacitor 3 is formed, and second extended wiring 7b (corresponds to "connection-extending electrode film" in the present description) connected to the lower electrode film 3a is also formed. For example, the first extended wiring 7a is so formed as to extend from the upper surface of the insulation protection layer 4 to an inner wall surface of the first through-hole 6a. Then, an extending portion of the first extended wiring 7a covers, in the first through-hole 6a, an area of the upper electrode film 3c seen from the first through-hole 6a and the inner wall surface of the first through-hole 6a, whereby the first extended wiring 7a is connected to the upper electrode film 3c. Here, a portion of the first extended wiring 7a formed on one principal surface of the insulation protection layer 4 and a portion thereof formed on the inner wall surface of the first through-hole 6a are integrally formed by a film deposition technique such as sputtering or the like. Note that the second extended wiring 7b has the same configuration as the first extended wiring 7a.

The rewiring layer 5 includes a first resin layer 5a that is laminated on the upper surface of the insulation protection layer 4 while covering the first extended wiring 7a and the second extended wiring 7b, and a second resin layer 5b laminated on the first resin layer 5a. The first resin layer 5a and the second resin layer 5b each have a single-layer or multilayer structure of resin layer formed of phenol resin, epoxy resin, polyimide, or the like.

On one principal surface of the first resin layer 5a, first rewiring 8a, second rewiring 8b, and third rewiring 8c are formed using a film deposition technique like the first extended wiring 7a and the second extended wiring 7b. In the case where the first rewiring 8a (corresponds to "rewiring electrode film" in the present description) is taken as an example to give the explanation herein, the third through-hole 6c (corresponds to "rewiring through-hole" in the present description) is formed in the first resin layer 5a while penetrating the first resin layer 5a in the thickness direction so as to expose the first extended wiring 7a at a position overlapping with the first extended wiring 7a. The first rewiring 8a is formed on the one principal surface of the first resin layer 5a so as to extend along an inner wall surface of the third through-hole 6c. More specifically, an extending portion of the first wiring 8a is formed so as to cover, in the third through-hole 6c, an area of the first extended wiring 7a seen from the third through-hole 6c and the inner wall surface of the third through-hole 6c, whereby the first rewiring 8a is connected to the first extended wiring 7a. Further, the third rewiring 8c is connected to the second extended wiring 7b in the same manner as in the case of the first rewiring 8a.

In order to reduce the stress applied to the thin-film capacitor 3, the third through-hole 6c is formed, as shown in FIG. 2, at a position not overlapping with the thin-film capacitor 3 when viewed from above in the thickness direction of the first resin layer 5a. It is to be noted that FIG. 2 is a diagram for explaining an arrangement relationship between the thin-film capacitor 3 and the rewiring through-hole 6c, and the drawing does not strictly correspond to FIG. 1 in terms of length, size, and so on.

Further, in the first resin layer 5a, the first thin-film resistor 9a and the second thin-film resistor 9b (each correspond to "thin-film circuit element" in the present description) are provided. For example, the first thin-film resistor 9a is inserted and connected in series between the first rewiring 8a and the second rewiring 8b, as shown in FIG. 1.

The second resin layer 5b is laminated on the first resin layer 5a while covering the first rewiring 8a, second rewiring 8b, and third rewiring 8c. Here, cavities 10a and 10b are provided so as to expose part of the second wiring 8b (part of the portion formed on the upper surface of the first resin layer 5a) and part of the third rewiring 8c (part of the portion formed on the upper surface of the first resin layer 5a), respectively. Then, on the second rewiring 8b exposed from the cavity 10a, an outer electrode 11a (corresponds to "third outer terminal" in the present description, and is hereinafter referred to as "third outer terminal 11a") is formed being plated with Ni/Au; on the third rewiring 8c exposed from the cavity 10b, an outer electrode 11b (corresponds to "second outer terminal" in the present description, and is hereinafter referred to as "second outer terminal 11b") is formed being plated with Ni/Au. Further, in the second resin layer 5b, first and fourth outer terminals to be explained later are formed in the same configuration as that of the second and third outer terminals 11a and 11b.

The composite electronic component 1 configured as discussed above is used as a capacitance device that makes use of a bias voltage effect in which the first and second outer terminals 11b and 11c are used as input/output terminals. To be more specific, as shown in FIG. 3, a voltage applied across the thin-film capacitor 3 is arbitrarily adjusted through the first thin-film resistor 9a and second thin-film resistor 9b by adjusting a voltage between the third and fourth outer terminals 11a and 11d, whereby the component can be used as a variable capacitance device configured to adjust the capacitance of the thin-film capacitor 3.

(Manufacturing Method of Composite Electronic Component)

Hereinafter, an example of a manufacturing method of the composite electronic component 1 will be described. First, a Pt film to form the lower electrode film 3a of the thin-film capacitor 3 is deposited by sputtering on the one principal surface of the insulation substrate 2 where a $SiO_2$ film has been formed through surface oxidation. Subsequently, in order to form the dielectric film 3b, a solution in which each of Ba, Sr, and Ti organometallic salts or metallic alkoxide is dissolved in an organic solvent is applied on the Pt film, and then calcination is carried out to form the dielectric layer. Next, sputtering is carried out on the dielectric layer to deposit a Pt film for forming the upper electrode film 3c. Subsequently, in order to obtain a desired capacitance for the thin-film capacitor 3, the Pt film, the dielectric layer, and the Pt film laminated in that order are shaped to a predetermined size. To be more specific, a photoresist is applied on the above multilayer body, a resist pattern is formed by performing exposure and development using a predetermined photomask, and then the thin-film capacitor 3 having a desired capacitance is formed through a reactive ion etching process. Thereafter, the crystal grain growth is facilitated by heat treatment so that the characteristics of the dielectric film 3b are sufficiently exhibited. Note that the dielectric layer may be formed by, in addition to the above method, a sputtering method, a chemical vapor deposition (CVD) method, or the like.

Next, the insulation protection layer 4 is formed on the one principal surface of the insulation substrate 2 so as to cover the thin-film capacitor 3. In this case, the inorganic protection layer 4a and the resin protection layer 4b are laminated in that order.

Next, the first and second through-holes 6a and 6b are formed at predetermined positions in the insulation protection layer 4. For example, the first and second through-holes 6a and 6b are formed in the resin protection layer 4b by performing exposure and development using a predetermined photomask on the resin protection layer 4b in which the photosensitive resin is used; thereafter, by carrying out reactive ion etching on the inorganic protection layer 4a with the resin protection layer 4b serving as a resist, the first and second through-holes 6a and 6b can also be formed in the inorganic protection layer 4a.

Next, on the upper surface of the insulation protection layer 4 in which the first and second through-holes 6a and 6b are formed, a Cu/Ti film is deposited by sputtering, and then the Cu/Ti film is formed into a desired pattern by etching so as to form the first extended wiring 7a and the second extended wiring 7b. With this, a portion of the first extended wiring 7a on the one principal surface of the insulation protection layer 4 (in-plane conductor portion) and a portion thereof extending along the inner wall surface of the first through-hole 6a (interlayer connection portion) are integrally formed, for example.

Next, the first resin layer 5a is laminated on the one principal surface of the insulation protection layer 4 so as to cover the first extended wiring 7a and second extended wiring 7b. In this case, the first resin layer 5a is formed by laminating a plurality of resin layers, and the first thin-film resistor 9a and second thin-film resistor 9b are formed during the above lamination process. The first thin-film resistor 9a and second thin-film resistor 9b can be formed by, for example, a vapor deposition lift-off method. Since the first extended wiring 7a and second extended wiring 7b are each formed with a thin-film, the first and second through-holes 6a and 6b are not filled with conductive material, unlike a general via conductor. As such, when the first resin layer 5a is formed, the resin of the first resin layer 5a enters into the first and second through-holes 6a and 6b.

Next, the third through-hole 6c is formed in the same manner as the first and second through-holes 6a and 6b, and the first rewiring 8a, second rewiring 8b, and third rewiring 8c are formed in the same manner as the first extended wiring 7a and second extended wiring 7b. At this time, the third through-hole 6c is formed at a position not overlapping with the thin-film capacitor 3 when viewed from above in the thickness direction of the first resin layer 5a.

Next, the second resin layer 5b is laminated on the one principal surface of the first resin layer 5a so as to cover the first rewiring 8a, second rewiring 8b, and third rewiring 8c. At this time, the lamination is carried out so that portions of the predetermined wiring (for example, the second rewiring 8b and third rewiring 8c) that form the first, second, third, and fourth outer terminals 11a, 11b, 11c, and 11d are exposed. Also in this case, the resin forming the second resin layer 5b enters into the third through-hole 6c like in the cases of the first and second through-holes 6a and 6b.

Finally, by plating the above exposed portions with Ni/Au, the first, second, third, and fourth outer terminals 11a, 11b, 11c, and 11d are formed, whereby the composite electronic component 1 is completed.

In the case where the first rewiring 8a, second rewiring 8b, and third rewiring 8c are formed with a thin-film as discussed above, there arises a problem that the insulation resistance of the thin-film capacitor decreases in the conventional technique. As such, the inventors of the present invention have found it possible to improve the above situation in which the insulation resistance of the thin-film capacitor 3 decreases by forming the through-hole 6c provided in the first resin layer 5a at a position not overlapping with the thin-film capacitor 3 when viewed from above. The reason for this can be thought of as follows.

Figure 4:
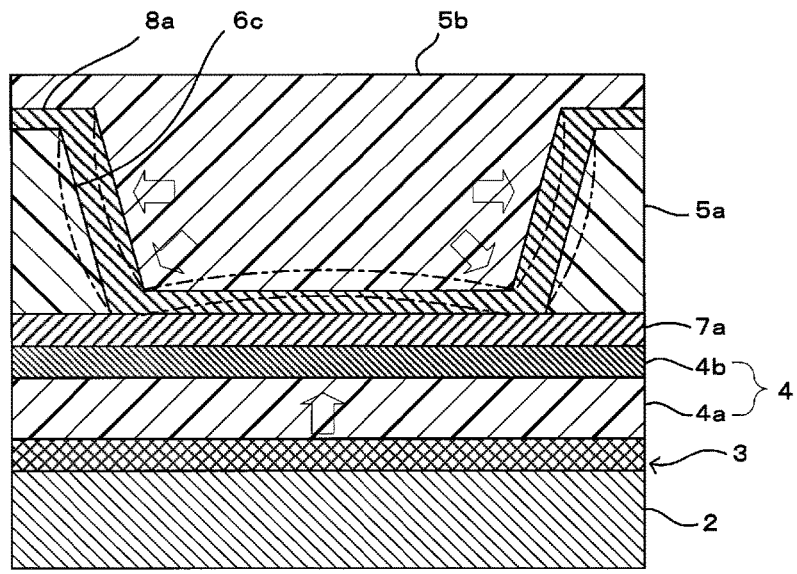
FIG. 4 is a diagram for explaining stress that is applied to the periphery of a rewiring through-hole.
Figure 5:
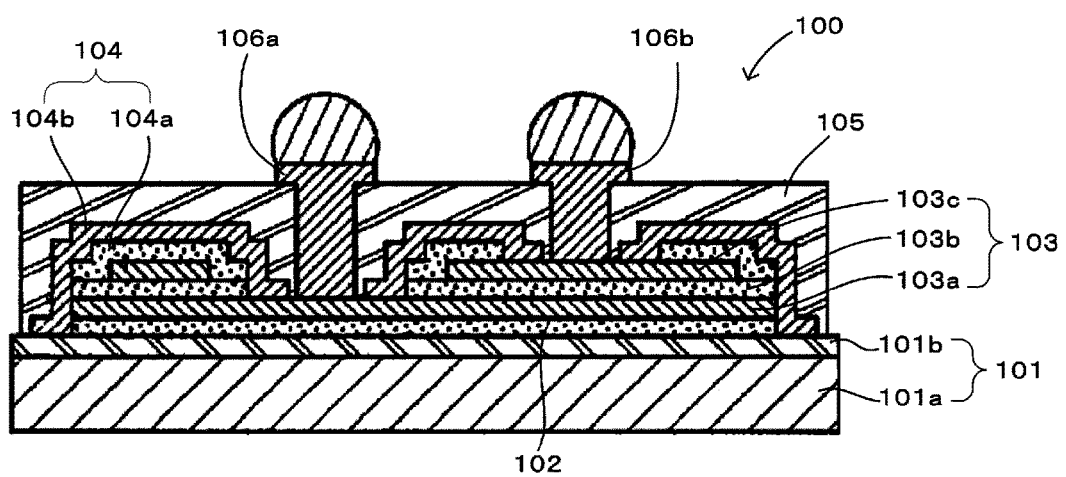
FIG. 5 is a cross-sectional view of a conventional electronic component.

That is, as shown in FIG. 4, for example, like the first rewiring 8a, in the case where an in-plane conductor portion (a portion formed on the one principal surface of the first resin layer 5a) and an interlayer connection portion (a portion formed in the third through-hole 6c) are integrally formed by sputtering, a portion of the first rewiring 8a that covers the first extended wiring 7a facing the third through-hole 6c (extended wiring covering portion) is formed having its film thickness thicker than the film thickness of a portion thereof that covers the inner wall surface of the third through-hole 6c (inner wall covering portion).

Then, in a state where the composite electronic component 1 is completed, the resin of the second resin layer 5b has entered into and filled the third through-hole 6c. With this configuration, in the case where the composite electronic component 1 is set under a high temperature environment, a high humidity environment, or the like, for example, the resin having entered into the third through-hole 6c expands. Because the extended wiring covering portion of the first rewiring 8a is thicker in film thickness than the inner wall covering portion thereof, in the case where the resin within the third through-hole 6c expands, an expansion force of the resin presses and widens the inner wall covering portion of the first rewiring 8a as shown in FIG. 4. Along with this, the extended wiring covering portion of the first rewiring 8a is so deformed as to be pushed upward. Because of this, in the case where the thin-film capacitor 3 is positioned immediate under the third through-hole 6c, for example, upward tensile stress is applied to the thin-film capacitor 3 resulted from the above deformation of the first rewiring 8a. This tensile stress causes the close contact between the upper electrode film 3c and the dielectric film 3b of the thin-film capacitor 3 or the close contact between the lower electrode film 3c and the dielectric film 3b thereof to be loosened. As a result, a situation in which the lower electrode film 3a or the upper electrode film 3c does not sufficiently make contact with the dielectric film 3b arises, whereby the insulation resistance of the thin-film capacitor 3 is decreased. According to the experiments made by the inventors of the present invention, it is confirmed that the situation in which the insulation resistance of the thin-film capacitor 3 is decreased is improved by arranging the third through-hole 6c at a position not overlapping with the thin-film capacitor 3 when viewed from above. Note that FIG. 4 is a diagram for explaining the stress that is applied to the periphery of the third through-hole 6c.

As such, according to the embodiment discussed above, because forming the third through-hole 6c at a position shifted from the thin-film capacitor 3 (a position not overlapping with the capacitor) when viewed from above in the thickness direction of the first resin layer 5a makes it possible to distance the third through-hole 6c and the thin-film capacitor 3 from each other, the stress applied to the thin-film capacitor 3 can be reduced. In addition, because the tensile stress applied to the thin-film capacitor 3 in the laminating direction is reduced, the close contact between the upper electrode film 3c and the dielectric film 3b of the thin-film capacitor 3 or the close contact between the lower electrode film 3c and the dielectric film 3b thereof is ensured, whereby the insulation resistance of the thin-film capacitor 3 can be prevented from decreasing.

It is to be noted that the present invention is not limited to the above-described embodiment, and various kinds of modifications can be made, in addition to those discussed above, without departing from the spirit of the invention. For example, although a case in which the first and second thin-film resistors 9a and 9b are formed in the first resin layer 5a of the rewiring layer 5 is described in the above embodiment, those resistors may be formed in any one of the first resin layer 5a and the second resin layer 5b.

The thin-film circuit elements are not limited to the above-described first and second thin-film resistors 9a and 9b, and they may be inductors formed with a thin-film, for example.

The present invention can be widely applied to various types of composite electronic components including thin-film capacitors and thin-film circuit elements electrically connected to the stated thin-film capacitors.

EXPLANATION OF REFERENCE NUMERALS 1 composite electronic component
2 insulation substrate
3 thin-film capacitor
4 insulation protection layer
5 rewiring layer
5a first resin layer
5b second resin layer
6a first through-hole (connection-extending through-hole)
6c third through-hole (rewiring through-hole)
9a first thin-film resistor 9b second thin-film resistor
11a outer electrode (third outer terminal)
11b outer electrode (second outer terminal)
11c first outer terminal
11d fourth outer terminal

The invention claimed is:

1. A composite electronic component comprising:
an insulation substrate having a principal surface;
a capacitor having opposed conductor layers and a dielectric film therebetween on the principal surface of the insulation substrate;
an insulation protection layer on the principal surface of the insulation substrate and covering the capacitor;
a connection-extending through-hole that penetrates the insulation protection layer in a thickness direction thereof so as to expose at least a portion of one of the opposed conductor layers of the capacitor;
a connection-extending electrode film that extends within the connection-extending through-hole and is connected to the exposed portion of the one of the opposed conductor layers of the capacitor;
a rewiring layer covering the insulation protection layer and including a first resin layer disposed on the insulation protection layer and covering the connection-extending electrode film; and a second resin layer on the first resin layer;
at least one circuit element in the rewiring layer and electrically connected to the capacitor;
a rewiring through-hole that penetrates the first resin layer of the rewiring layer in a thickness direction thereof so as to expose at least a portion of the connection-extending electrode film at a position that does not overlap the capacitor; and
a rewiring electrode film that is directly connected to the at least one circuit element and that extends within the rewiring through-hole and is connected to the exposed portion of the connection-extending electrode film,
wherein the second resin layer fills an interior of the rewiring through-hole.

2. The composite electronic component according to claim 1, wherein the at least one circuit element in the rewiring layer is a resistor.

3. The composite electronic component according to claim 2, further comprising:
a first terminal connected to a first end of the capacitor;
a second terminal connected to a second end of the capacitor; and
a third terminal connected to a first end of the resistor,
wherein the first end of the capacitor is connected to a second end of the resistor.

4. The composite electronic component according to claim 1, wherein the rewiring layer includes a first and a second circuit element.

5. The composite electronic component according to claim 4, wherein the first circuit element is a first resistor and the second circuit element is a second resistor.

6. The composite electronic component according to claim 5, further comprising:
a first terminal connected to a first end of the capacitor;
a second outer terminal connected to a second end of the capacitor;
a third terminal connected to a first end of the first resistor; and
a fourth terminal connected to a first end of the second resistor,
wherein the first end of the capacitor is connected to a second end of the first resistor, and
the second end of the capacitor is connected to a second end of the second resistor.

7. The composite electronic component according to claim 1, wherein the insulation protection layer includes:
a first protection layer on the principal surface of the insulation substrate and that covers the capacitor; and
a second protection layer on the first protection layer.

8. The composite electronic component according to claim 7, wherein the connection-extending through-hole penetrates the first protection layer and the second protection layer so as to expose the at least the portion of the one of the opposed conductor layers of the capacitor.

9. The composite electronic component according to claim 7, wherein the first protection layer is SiO2, and the second protection layer is a photosensitive polyimide material.

10. The composite electronic component according to claim 1, wherein a material of the rewiring layer is selected from the group consisting of phenol resin, epoxy resin and polyimide resin.

* * * * *